(12) United States Patent
Ganor et al.

(10) Patent No.: US 7,119,477 B1
(45) Date of Patent: Oct. 10, 2006

(54) REPLACEABLE FRICTION COUPLING FOR PIEZOELECTRIC MOTORS

(75) Inventors: Ze'ev Ganor, Herzelia (IL); Nir Karasikov, Haifa (IL); Hanna Dodiuk-Kenig, Haifa (IL)

(73) Assignee: Nanomotion Ltd., Yokneam (IL)

(*) Notice: Subject to any disclaimer, the term of this patent is extended or adjusted under 35 U.S.C. 154(b) by 0 days.

(21) Appl. No.: 10/129,247

(22) PCT Filed: Oct. 31, 1999

(86) PCT No.: PCT/IL99/00575

§ 371 (c)(1),
(2), (4) Date: Aug. 21, 2002

(87) PCT Pub. No.: WO01/33647

PCT Pub. Date: May 10, 2001

(51) Int. Cl.
*H01L 41/04* (2006.01)
*H02N 2/00* (2006.01)

(52) U.S. Cl. .......................... 310/323.13; 310/323.09; 310/323.17

(58) Field of Classification Search ........... 310/323.08, 310/323.09, 323.13, 323.17, 323.18, 328
See application file for complete search history.

(56) References Cited

U.S. PATENT DOCUMENTS

| | | | | |
|---|---|---|---|---|
| 4,963,781 A | * | 10/1990 | Sumihara et al. ............ | 310/328 |
| 5,162,692 A | * | 11/1992 | Fujimura ................ | 310/323.15 |
| 5,453,653 A | * | 9/1995 | Zumeris ................ | 310/323.16 |
| 5,543,670 A | * | 8/1996 | Luecke ........................ | 310/26 |
| 5,698,930 A | * | 12/1997 | Takagi .................... | 310/323.03 |
| 6,373,170 B1 | * | 4/2002 | Hills ......................... | 310/328 |
| 6,384,514 B1 | * | 5/2002 | Slutskiy et al. ......... | 310/323.17 |

* cited by examiner

*Primary Examiner*—Thomas M. Dougherty
(74) *Attorney, Agent, or Firm*—Fenster & Company

(57) ABSTRACT

A piezoelectric motor comprising: a piezoelectric vibrator (50) having a surface comprising a localized non-planar shaped first surface region thereon which first surface region has a shape different from the shape of the surface on which it is located; and a friction nub (52) formed with a second surface region that is substantially a negative relief of the first surface region, which first and second regions are bonded together. Preferably the friction nub (52) is detachably mounted to the vibrator (50) via a boss (54) waving a protuberance (56) of conical shape. Alternatively the friction nub (52) has a protuberance (76) which is form-fitted to a recess (72) in the vibrator (50) or boss (70), respectively. First and second surface regions can also be threading surfaces.

28 Claims, 7 Drawing Sheets

REPLACEABLE FRICTION COUPLING FOR PIEZOELECTRIC MOTORS

FIELD OF THE INVENTION

The invention relates to piezoelectric motors and in particular to methods of coupling a piezoelectric motor to a moveable element.

BACKGROUND OF THE INVENTION

A piezoelectric motor uses a piezoelectric vibrator to transduce electrical energy into kinetic energy that the motor transmits to a moveable body to which the motor is coupled. The motor is generally coupled to a body that it moves by resiliently pressing the motor to the body so that a surface region, hereinafter referred to as a "coupling surface", of the piezoelectric vibrator contacts a surface region of the body. Electrodes in the motor are electrified to excite vibrations in the vibrator that cause the coupling surface to vibrate. Motion is transmitted from the vibrating coupling surface to move the body by frictional forces between the coupling surface and the surface region of the body to which the coupling surface is pressed.

The frictional forces coupling a piezoelectric motor to a body it moves might abrade the motor's coupling surface and in time might damage the coupling surface to the extent that the motor is no longer serviceable. Traveling wave piezoelectric motors that use vibrators formed from relatively soft piezoelectric material are worn out relatively quickly by abrasion. Typically, a traveling wave piezoelectric motor wears out after transmitting kinetic energy to a body that it moves that is equivalent to moving the body a cumulative "travel distance" on the order of hundreds of kilometers.

A piezoelectric standing wave motor of a type described in U.S. Pat. No. 5,453,653, to Zumeris et al, the disclosure of which is incorporated herein by reference, comprises a vibrator formed from a ceramic piezoelectric crystal. A hard wear resistant nub, hereinafter referred to as a "friction nub", preferably formed from a hard tough ceramic material is bonded to a surface region of vibrator. To transmit motion from the vibrator to a moveable body, the friction nub, rather than a surface region of the piezoelectric crystal, is pressed to the body. The friction nub is substantially more resistant to abrasion than the piezoelectric ceramic. As a result, the operational lifetime of the motor is considerably increased over that of piezoelectric motors without such nubs. The motor is capable of being used to transmit kinetic energy to the body equivalent to travel distances well in excess of 10,000 kilometers before the friction nub wears and motor performance degrades.

Even though a friction nub extends the operational lifetime of a piezoelectric motor substantially, it is desirable to have piezoelectric motors characterized by operational lifetimes greater than operational lifetimes of piezoelectric motors that transmit motion to a body via a friction nub.

SUMMARY OF THE INVENTION

An aspect of the present invention relates to providing a piezoelectric motor having an operational lifetime greater than operational lifetimes that characterize prior art piezoelectric motors.

A piezoelectric motor, in accordance with a preferred embodiment of the present invention, comprises a piezoelectric vibrator having a boss, hereinafter referred to as a "coupling boss", bonded to a surface thereof. Preferably, the coupling boss comprises a "coupling" protuberance. A friction nub formed with a socket having a shape that matches the shape of the coupling boss is attached to the vibrator by inserting the coupling protuberance into the socket and fixing the friction nub to the coupling boss so that they do not move with respect to each other. Motion is transmitted from the vibrator to a moveable body via the friction nub, which is resiliently pressed to a surface region of the body. When the friction nub is damaged by abrasion, it is removed from the coupling boss and replaced by a new friction nub. As a result, the operational lifetime of the motor is not limited by the lifetime of a friction nub, and the operational lifetime of the motor is substantially extended beyond operational lifetimes of prior art piezoelectric motors.

Preferably, the coupling boss is bonded to the surface of the piezoelectric motor by gluing a surface of the coupling boss to the surface of the piezoelectric motor. Preferably, the surface of the coupling boss that is glued to the piezoelectric motor is formed with at least one groove that is filled with glue when the coupling boss is bonded to the piezoelectric vibrator. The at least one groove provides room for a greater mass of glue to reside between the glued surfaces than is possible in the absence of the at least one groove. The increased mass of glue improves the bond between the coupling boss and the surface of the piezoelectric motor. In some preferred embodiments of the present invention at least one groove is located on the surface of the piezoelectric vibrator to which the boss is glued.

Preferably, the coupling protuberance has a shape that is formed to a high tolerance. Preferably the shape has an axis of rotation about which the shape is circularly symmetric. Preferably, the surface of the socket in the friction nub is an accurate negative relief of the surface of the coupling protuberance.

In some preferred embodiments of the present invention, the friction nub is fixed to the coupling boss by bonding a surface region of the friction nub to a surface region of the coupling boss. Preferably, the bonding is accomplished by gluing a surface region of the coupling protuberance to a surface region of the socket.

In some preferred embodiments of the present invention the coupling protuberance is conical. In some preferred embodiments of the present invention the conical protuberance is a "Morse" cone which is a cone having an angle equal to about 7°. The friction nub is preferably fixed to the coupling boss, without the use of glue, by press fitting the Morse cone into the matching socket in the friction nub. It is known in the art that two elements, one of which comprises a conical surface shaped as a Morse cone and the other having a matching socket, can be securely coupled to each other by press fitting the Morse cone on the one element into the matching socket in the other element. Preferably, the boss and Morse cone are formed from steel or brass. Preferably the friction nub is formed from Alumina.

In some preferred embodiments of the present invention the coupling boss is formed with the socket instead of with the coupling protuberance and the friction nub is formed with the coupling protuberance. In some preferred embodiments of the present invention, in which the friction nub is formed with the coupling protuberance, a coupling boss is not bonded to the piezoelectric motor. Instead a socket matching the coupling protuberance is formed directly into a surface of the motor.

Releasing the friction nub from the coupling boss is preferably accomplished by stressing the bonds between the surface of the coupling boss and the socket until the bonds break. Preferably, stressing the bonds is performed by applying a torque to the friction nub that has a component along the axis of rotation of the coupling protuberance. Preferably, the external surface of the friction nub is formed with a shape that aids in grasping and applying torque to the friction nub. Preferably, the shape is matched to a recess in a tool that is used to apply the torque to the friction nub.

In accordance with another preferred embodiment of the present invention, a coupling boss is formed with a threaded post and the friction nub is formed with a matching threaded hole. The friction nub is mounted to the boss by screwing it onto the post and when worn, is removed by unscrewing it from the post. In a variation of a screw mounted friction nub, in accordance with a preferred embodiment of the present invention, the friction nub is formed with the threaded post and the boss is formed with the matching threaded hole. In some preferred embodiments of the present invention, in which the friction nub is formed with a threaded post, the matching threaded hole is not formed in a boss mounted to the piezoelectric motor but in the motor itself. The friction nub is mounted directly to the piezoelectric motor by screwing it into the threaded hole in the motor.

An aspect of some preferred embodiments of the present invention relates to providing a piezoelectric motor that can be adapted to improve its performance for different applications. In accordance with preferred embodiments of the present invention a friction nub is not only replaced when it is worn, but is replaced to better adapt the piezoelectric motor to an application for which it is used.

In accordance with preferred embodiments of the present invention, a material from which a friction nub fitted to a piezoelectric motor is formed, is chosen to provide desired characteristics of motion that the piezoelectric motor transmits to a moveable body. Friction nubs formed from different materials are mounted to the motor, as required, to adapt the motor to different motion transfer requirements.

In some preferred embodiments of the present invention the friction nub is formed from a hard wear resistant material such as steel, Alumina or a high impact plastic such as PEEK (polyethyl ethyl ketone). Relatively hard materials are used for the friction nub when a piezoelectric motor is required to move a body rapidly and requirements for accuracy of motion and/or positioning of the body are relatively relaxed. Softer materials are preferable for applications that require highly accurate motion or positioning of a body. The inventors have found that for applications requiring accurate motion or positioning of a body, preferably, the friction nub is formed from a cermet alloy. Cermet refers to an alloy formed by bonding ceramic particles with a metal such as, for example, Ti, W, Ta or Mo. Cermet alloys of different composition and characteristics are well known in the art and are used, for example, for bearings, seals and cutting tools. Preferably the cermet used for the friction nub has a grain size less than 2.5 microns. More preferably, the grain size is less than 1.75 microns. Most preferably, the grain size is less than 1.4 microns.

There is therefore provided, in accordance with a preferred embodiment of the present invention a piezoelectric motor comprising: a piezoelectric vibrator having a surface comprising a localized non-planar shaped first surface region thereon or mounted thereon which first surface region has a shape different from the shape of the surface on which it is located; and a friction nub formed with a second surface region that is substantially a negative relief of the first surface region, which first and second regions are bonded together.

Preferably, bonds that bond the first and second surface regions together are breakable without damage to the vibrator by application of a force to the friction nub. Additionally or alternatively, the piezoelectric motor preferably comprises a boss bonded to a surface region of the piezoelectric vibrator, which boss comprises a protuberance and the first surface region is a surface of the protuberance.

Preferably, the protuberance is cylindrically symmetric. Additionally or alternatively the friction nub is preferably formed with a socket and the second surface region is an internal surface region of the socket.

Preferably the protuberance is conical. The protuberance is preferably a Morse cone having a height and a cone angle equal to a Morse angle. Preferably, the Morse cone is truncated. Preferably, the socket is cone shaped and has a cone angle substantially equal to the equal to the cone angle of the Morse cone.

For some piezoelectric motors, in accordance with some preferred embodiments of the present invention, the friction nub is formed with a protuberance and the second surface region is a surface region of the protuberance.

Preferably, the protuberance is cylindrically symmetric. Additionally or alternatively, the first surface region is preferably a surface of a socket formed in a boss that is bonded to a surface region of the piezoelectric vibrator. In some preferred embodiments of the present invention, the first surface region is an internal surface region of a socket formed in the surface of the vibrator.

Alternatively or additionally, preferably, bonds that bond the first and second surface regions together are breakable by application of a force to the nub, without damage to the boss, the vibrator or the bonding between the boss and the vibrator.

In some preferred embodiments of the present invention the protuberance is formed from steel. In some preferred embodiments of the present invention the protuberance is formed from brass.

There is further provided, in accordance with a preferred embodiment of the present invention a piezoelectric motor comprising: a piezoelectric vibrator having a first threaded surface; and a friction nub formed with a second threaded surface threadable onto the first threaded surface. Preferably, the first threaded surface is a surface of a post and the second threaded surface is a surface of a hole. Preferably the post is a post formed on a boss that is bonded to a surface region of the piezoelectric vibrator.

In some preferred embodiments of the present invention the first threaded surface is a surface of a hole and the second threaded surface is a surface of a post. Preferably, the hole is a hole in a boss mounted to the vibrator.

In some preferred embodiments of the present invention a surface region of the boss is glued to the surface region of the vibrator. Preferably, the surface region of the boss that is bonded to the vibrator is formed with at least one groove. Additionally or alternatively, the surface region of the vibrator to which the surface region of the boss is glued is formed with at least one groove.

In some preferred embodiments of the present invention, the friction nub is formed from a cermet alloy. Preferably, the cermet alloy has a grain size less than 2.5 microns. More preferably, the cermet alloy has a grain size less than 1.75 microns. Most preferably, the cermet alloy has a grain size less than 1.4 microns.

In some preferred embodiments of the present invention, the friction nub is formed with an external surface that facilitates grasping the friction nub with a grasping tool.

BRIEF DESCRIPTION OF FIGURES

The invention will be more clearly understood by reference to the following description of preferred embodiments thereof read in conjunction with the figures attached hereto. In the figures, identical structures, elements or parts which appear in more than one figure are generally labeled with the same numeral in all the figures in which they appear. Dimensions of components and features shown in the figures are chosen for convenience and clarity of presentation and are not necessarily shown to scale. The figures are listed below.

DETAILED DESCRIPTION OF PREFERRED EMBODIMENTS

Figure 1:
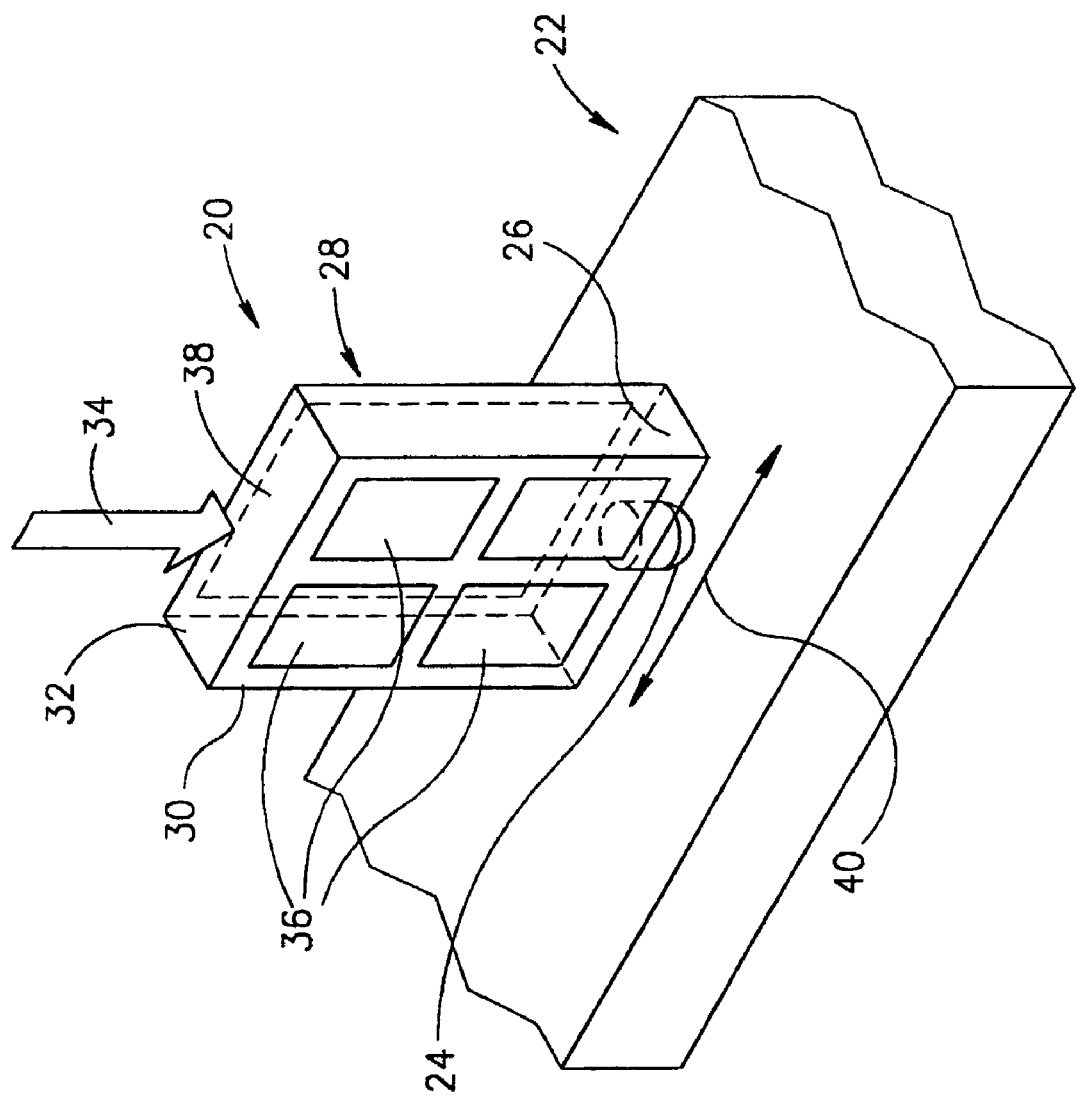
FIG. 1 schematically shows a prior art piezoelectric motor coupled to a body that it moves.

FIG. 1 schematically shows a piezoelectric motor 20 coupled to transmit motion to a moveable body 22 in accordance with prior art.

Piezoelectric motor 20 is, for example, of a type described in above referenced U.S. Pat. No. 5,453,653. Piezoelectric motor 20 comprises a friction nub 24 bonded to an edge surface 26 of a thin rectangular ceramic piezoelectric crystal 28 having a front planar surface 30 and a back planar surface 32. Back planar surface 32 and edge surface 26 are hidden in the perspective of FIG. 1 and are shown in ghost lines. A resilient force represented by block arrow 34 urges piezoelectric motor in a direction that brings friction nub 24 into contact with the surface of body 22.

Four quadrant electrodes 36 are located in a symmetric checkerboard pattern on front face surface 30. A single large electrode 38, shown in ghost lines, is located on back surface 32. Vibrations in piezoelectric motor 20 are excited as described in the patent by electrifying different combinations of quadrant electrodes 36 with respect to large electrode 38. The vibrations are controllable to generate vibratory motion in friction nub 24 that causes body 22 to move along a particular desired one of opposite directions indicated by double arrowhead line 40.

Frictional forces operative between friction nub 24 and the surface of body 22 during times that motor 20 moves body 22 abrade and damage friction nub 24. When damage to friction nub 24 reduces the performance of piezoelectric motor 20 to a point where it is not acceptable, motor 20 is no longer useable and must be replaced.

Figure 2A:
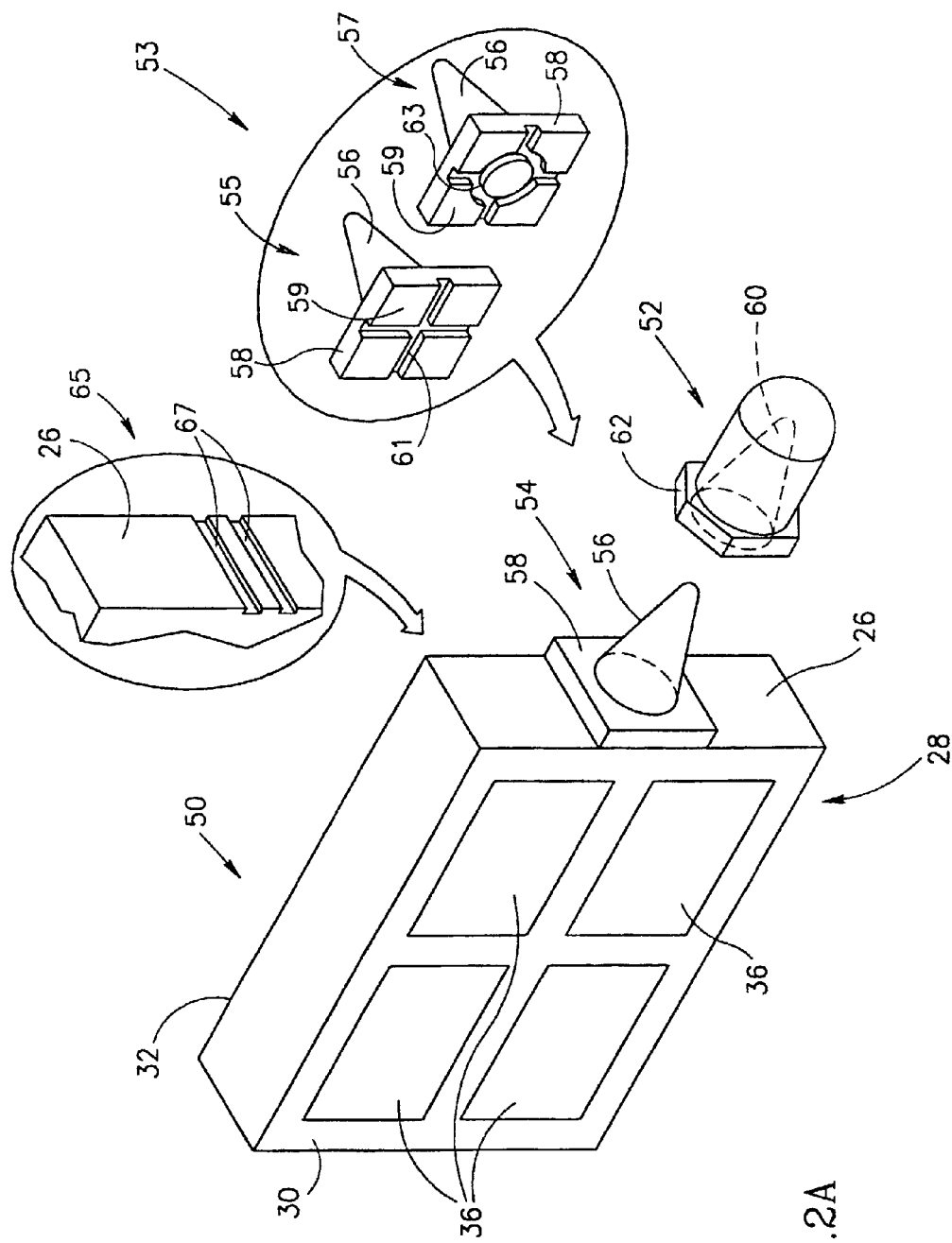
FIG. 2A schematically shows a partially exploded view of a piezoelectric motor comprising a friction nub, in accordance with a preferred embodiment of the present invention.

FIG. 2A schematically shows a partially exploded view of a piezoelectric motor 50 comprising a friction nub 52 in accordance with a preferred embodiment of the present invention. Piezoelectric motor 50, by way of example, is identical to piezoelectric motor 20 except for features related to friction nub 52.

Piezoelectric motor 50 comprises a coupling boss 54 preferably having a conical coupling protuberance 56 formed on a base 58, shown by way of example as rectangular in shape. Base 58 is firmly bonded to edge surface 26 of crystal 28. Preferably, coupling boss 54 is formed from metal and coupling protuberance 56 is shaped to suitable tolerances using methods known in the art.

Preferably, coupling boss 54 is bonded to edge 26 by gluing base 58 to edge surface 26. Preferably a surface of base 58 that is glued to face surface 26 is formed with at least one groove. Inset 53 of FIG. 2A shows two bosses 55 and 57 that are variants of boss 54. Bosses 55 and 57 are shown from a perspective from which a surface 59 of base 58 that is glued to edge surface 26 is seen. In accordance with preferred embodiments of the present invention, surface 59 of boss 55 is formed with a cross shaped groove 61 and surface 59 of boss 57 is formed with a groove pattern 63. When surface 59 of boss 55 and boss 57 is glued to edge surface 26 of piezoelectric crystal 28, groove 61 and groove 63 respectively fill with glue. Preferably, the grooves extend to an edge of surface 59 or have "bleeder" branches that extend to an edge of surface 59 to prevent air bubbles from being trapped between surface 59 and edge surface 26. The glue that fills groove 61 and groove 63 improves the strength and stability of the glue bond between surface 59 and edge surface 26. The shapes of grooves 61 and 63 are by way of example and different shaped grooves or a pattern comprising a plurality grooves are possible, in accordance with preferred embodiments of the present invention are possible and can be advantageous. For example surface 59 may be formed with a plurality of concentric circular grooves.

In some preferred embodiments of the present invention at least one groove is formed on surface 26 instead of, or in addition to, the at least one groove formed on the surface of coupling boss 54 that is glued to surface 26 to improve glue bonds between boss 54 and surface 26.

Inset 65 of FIG. 2A shows a region of surface 26 formed, by way of example, with two grooves 67 to strengthen glue bonds between coupling boss 54 and surface 26, in accordance with a preferred embodiment of the present invention. Other groove configurations, in accordance with preferred embodiments of the present invention, are possible and will readily occur to persons of the art.

Friction nub 52 is formed with a socket 60 shown in ghost lines that has a shape that accurately matches the shape of conical coupling protuberance 56. Friction nub 52 is attached to coupling boss 54 by inserting protuberance 56 into socket 60. As a result of the close tolerances to which protuberance 56 and socket 60 are formed, when protuberance 56 is inserted into socket 60 surface regions of protuberance 56 and socket 60 are in close contact. Preferably, friction nub 52 is fixed in place by gluing with an appropriate adhesive that forms adhesive bonds between the surface region of protuberance 56 and socket 60.

Preferably, the adhesive bonds are breakable so that friction nub 52 may be separated from boss 54 by application of a force to friction nub 54 that does not damage the motor, coupling boss 54 or the integrity of the bond between coupling boss 54 and the motor. Preferably, the force generates a torque having a component parallel to the axis of socket 60. Preferably, friction nub 52 is formed with an edge 62 shaped to facilitate application of the torque to friction nub 54. For example, edge 62 may be knurled, or it may have a polygonal shape as shown that is easily grasped and held by a tool, such as a socket wrench, having a socket that matches the polygonal shape. To separate friction nub 52 from coupling boss 54, the wrench is positioned to grasp polygonal edge 62 and twisted to break the adhesive bonds that hold friction nub in place.

Figure 2B:
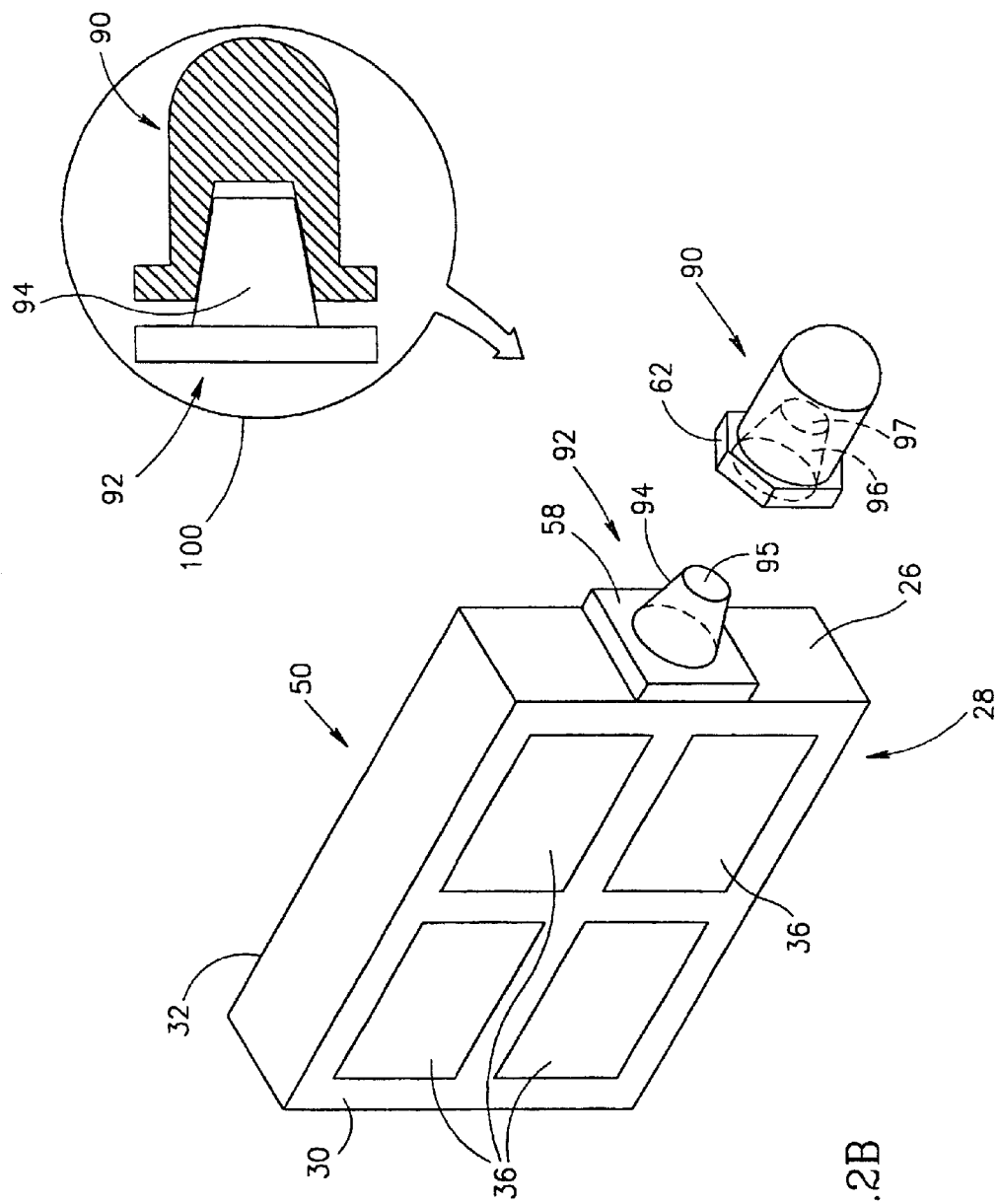
FIG. 2B schematically shows a partially exploded view of a piezoelectric motor comprising a friction nub mounted to a Morse cone, in accordance with a preferred embodiment of the present invention.

FIG. 2B schematically shows a partially exploded view of piezoelectric motor 50 comprising a friction nub 90, in accordance with a preferred embodiment of the present invention.

Piezoelectric motor 50 comprises a coupling boss 92 having a conical protuberance that is formed as a Morse cone 94. Preferably Morse cone 94 is truncated. Whereas Morse cone 94 in FIG. 2B is shown having a planar end surface 95 end surface 95 can have other shapes and may for example be rounded. Friction nub 92 has a matching conical socket 96 shown in ghost lines. The cone angle of socket 96 is substantially equal to the cone angle of Morse cone 94. Preferably, the height of socket 96 is greater than the height of Morse cone 94. Whereas socket 96 is shown as a truncated cone and having a planar top surface 97, top surface 97 can have other shapes and in some preferred embodiments of the present invention, socket 96 is not truncated. Friction nub 90 is fixed to boss 92 by press fitting Morse cone 94 into socket 96. Preferably, adhesive material is not used to secure friction nub 90 to Morse cone 94. Forces between Morse cone 94 and socket 96 generated by the shape of Morse cone 94 and matching socket 96 maintain the friction nub and socket securely coupled. Preferably, boss 92 and Morse cone 94 are formed from steel or brass. Inset 100 shows a cross sectional view of friction nub 90 mounted to Morse cone 94.

For applications for which piezoelectric motor 50 is required to move a body to which it is coupled with relatively high velocities or accelerations, but is not required to accurately control the motion or position of the body, preferably friction nub 90 is formed from steel or a hard ceramic. For applications in which piezoelectric motor 50 is required to accurately control the motion and position of a body that the piezoelectric motor moves, friction nub 90 is preferably formed from cermet alloy having a grain size less than 2.5 microns. More preferably, the grain size of the cermet alloy is less than 1.75 microns. Most preferably, the grain size is less than 1.4 microns.

Figure 2C:
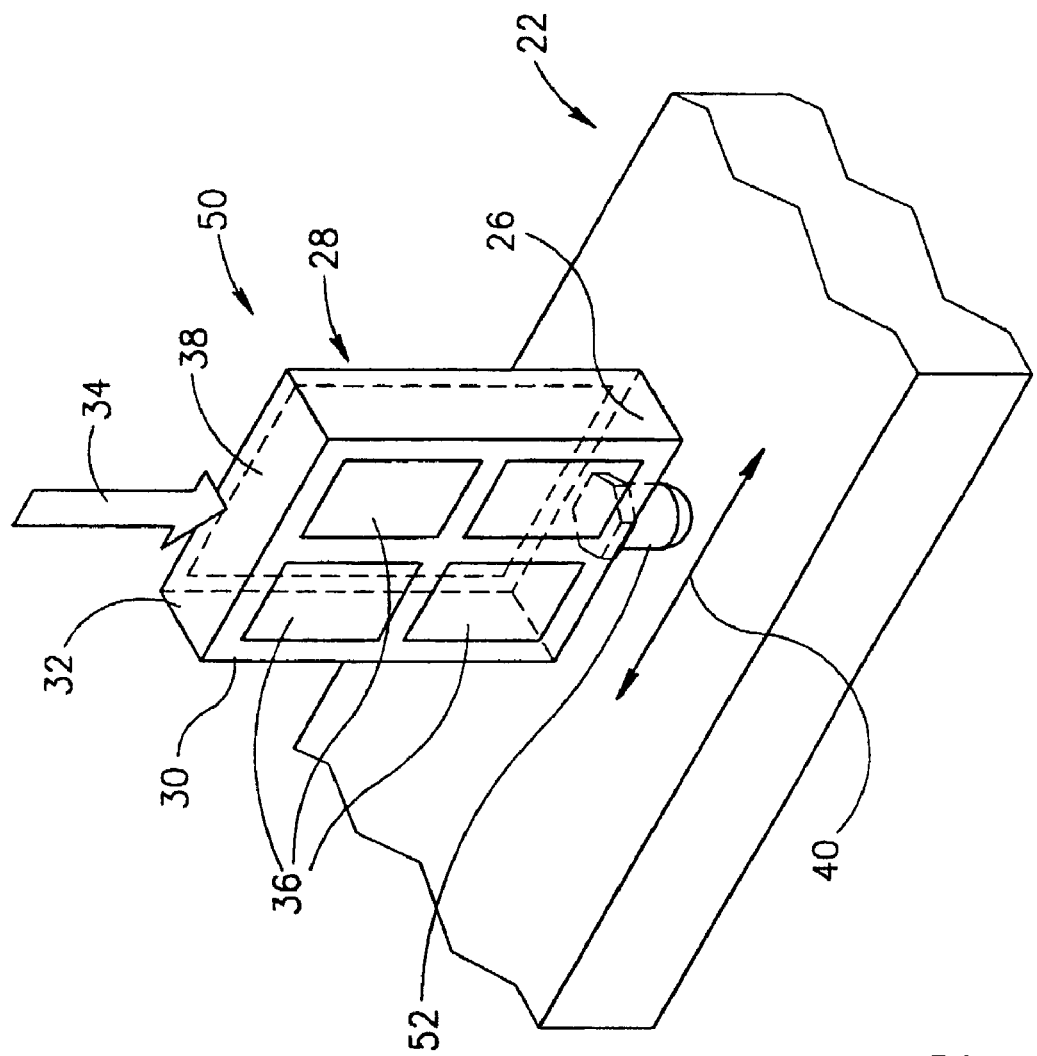
FIG. 2C schematically shows the piezoelectric motor shown in FIGS. 2A and 2B with the friction nub mounted in place and the piezoelectric motor coupled to a moveable body.

FIG. 2C shows friction nub 52 (or 90) mounted to piezoelectric motor 50 and motor 50 coupled to moveable body 22. When friction nub 52 is worn out by abrasion, it is separated from coupling boss 54 and replaced with a new friction nub 52, in accordance with a preferred embodiment of the present invention.

Whereas the shape of coupling protuberance 56 and socket 60 are conical, other preferably circularly symmetric shapes are useable for coupling protuberance 56 and socket 60 and such other shapes will readily occur to a person of the art. For example, coupling protuberance 56 may be hemispherical or it may be circularly cylindrical and have a convex or a concave end. Furthermore, whereas in FIGS. 2A and 2B, friction nub 52 comprises a socket and piezoelectric motor 50 is fitted with a coupling boss having a protuberance, in some preferred embodiments of the present invention the coupling boss has the socket and the friction nub has the matching protuberance.

It should be noted that protuberance 56 may have a shape, in accordance with a preferred embodiment of the present invention, other than a cylindrical shape, as long as the shape enables friction nub 54 to be relatively easily separated from the protuberance. For example, protuberance 56 may be a truncated pyramid with friction nub 54 having a matching socket. When friction nub 56 is mounted to the pyramid shaped protuberance it can be relatively easily (depending of course on the height and "pyramid" angle of the protuberance) separated from the protuberance by knocking the friction nub on a side surface of the friction nub. Other relatively easily "detachable" shapes for protuberance 56 will occur to persons of the art.

Figure 3:
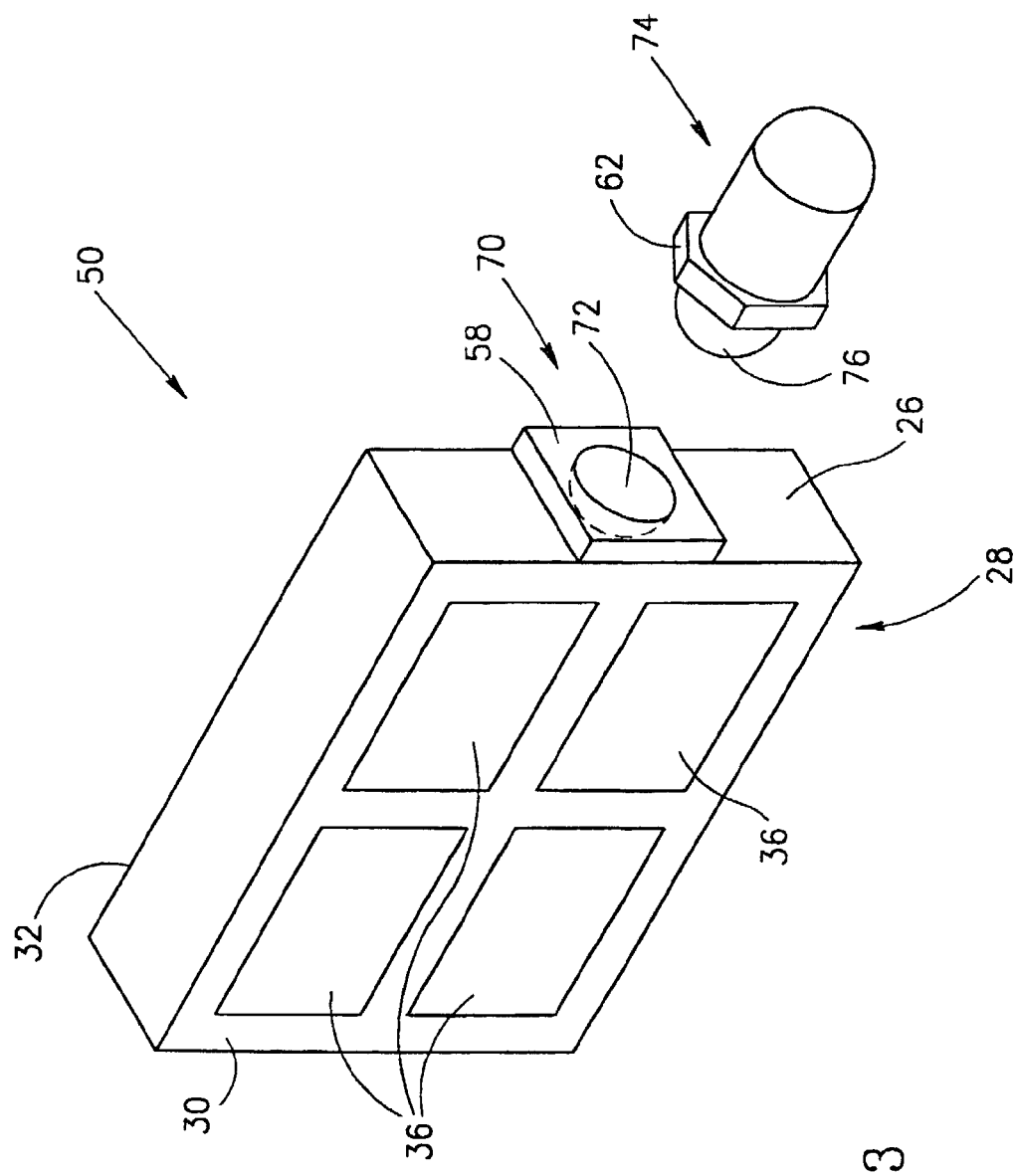
FIG. 3 schematically shows a partially exploded view of another piezoelectric motor comprising a friction nub, in accordance with a preferred embodiment of the present invention.

FIG. 3 schematically shows a partially exploded view of a piezoelectric motor 50 comprising a coupling boss 70 having a socket 72 and a friction nub 74 having a coupling protuberance 76, in accordance with a preferred embodiment of the present invention. Socket 72 and matching coupling protuberance 76 are shown, by way of example, as being substantially hemispherical.

Figure 4:
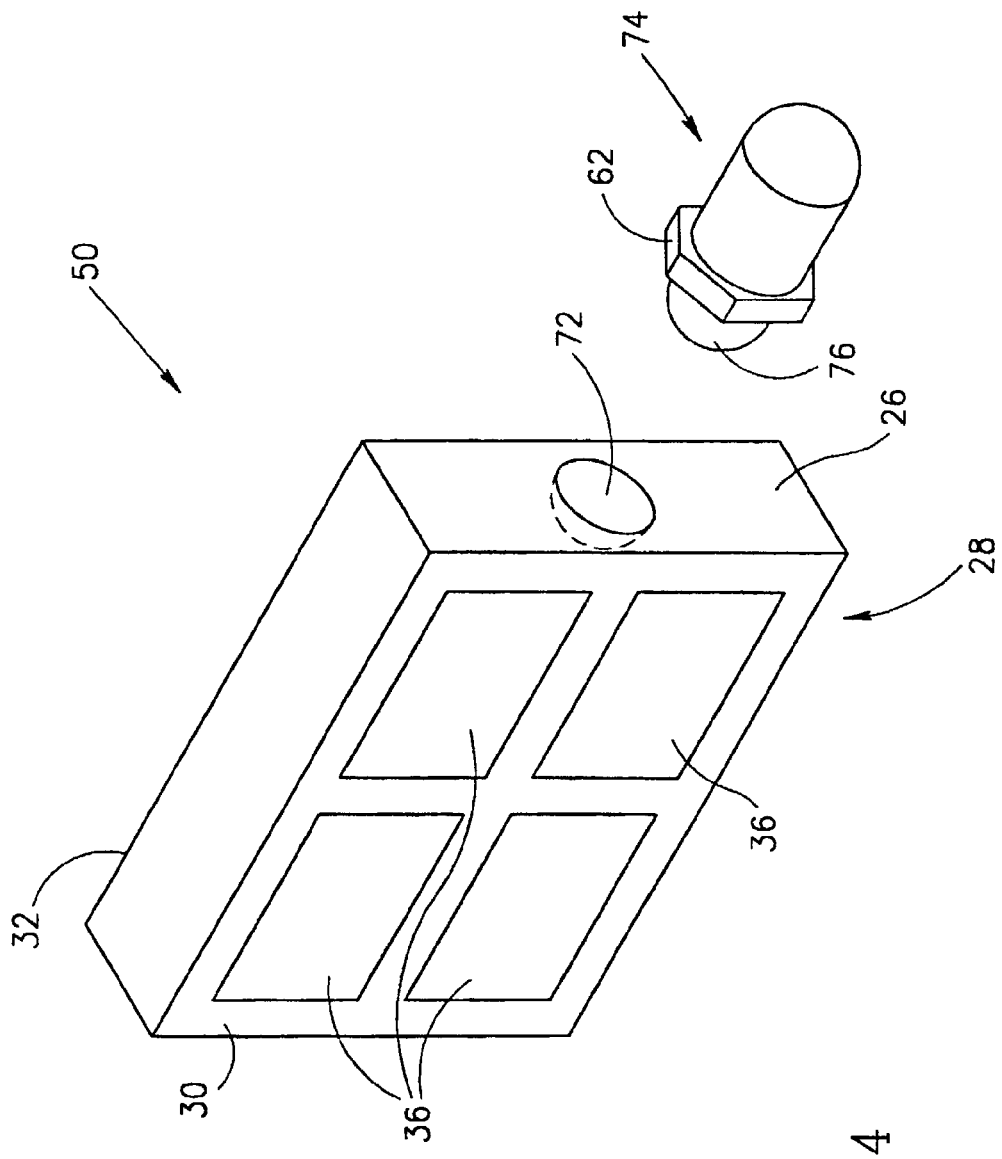
FIG. 4 schematically shows a partially exploded view of another piezoelectric motor comprising a friction nub, in accordance with a preferred embodiment of the present invention.

FIG. 4 schematically shows a partially exploded view of piezoelectric motor 50 and friction nub 74 having coupling protuberance 76, which are shown in FIG. 3. However, piezoelectric motor 50 shown in FIG. 4, unlike piezoelectric motor 50 shown in FIG. 3, does not comprise a coupling boss 70 formed with a socket. A socket 72 to match protuberance 76 is formed, in accordance with a preferred embodiment of the present invention, directly in edge surface 26.

Figure 5:
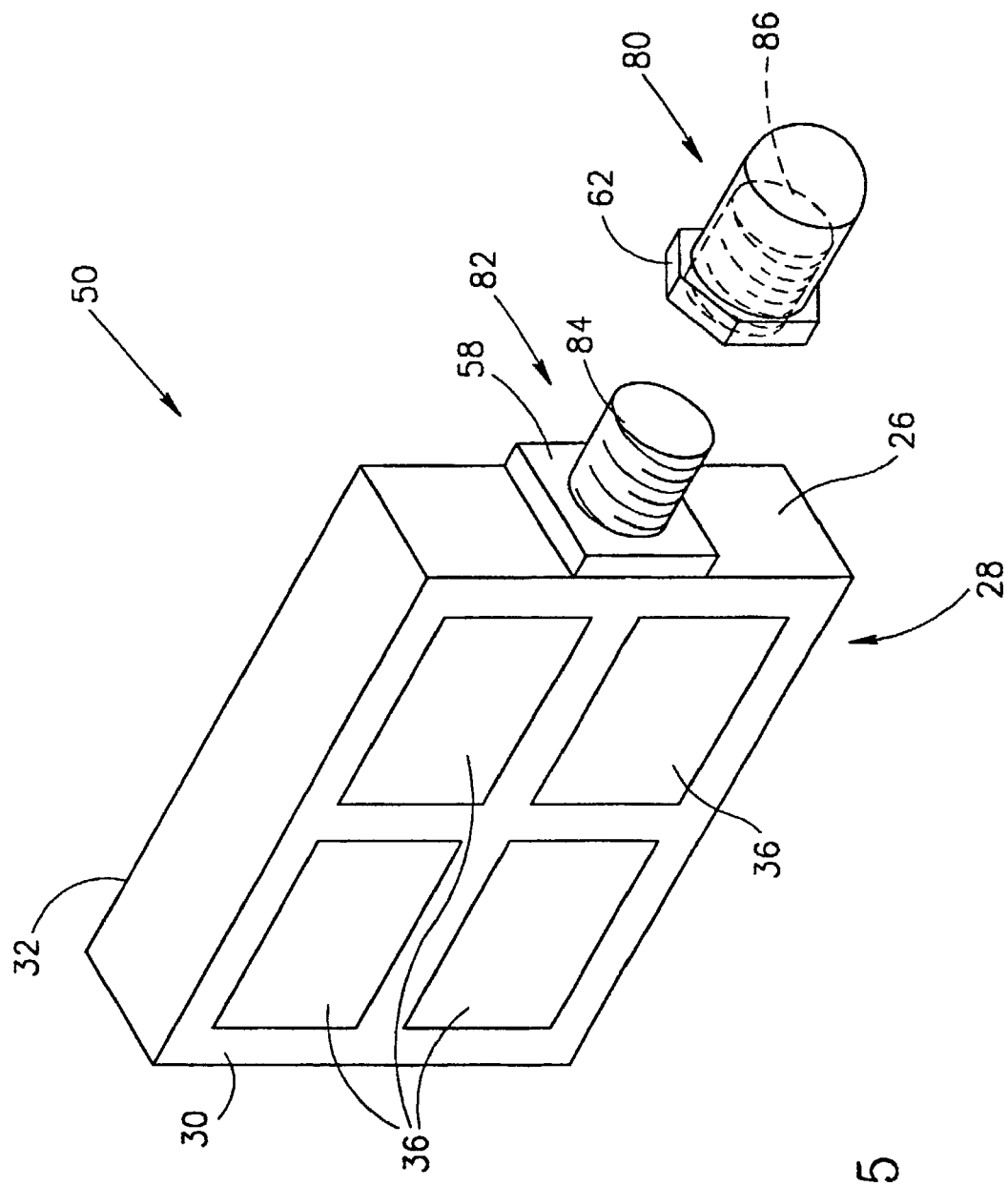
FIG. 5 schematically shows a partially exploded view of another piezoelectric motor comprising a friction nub, in accordance with a preferred embodiment of the present invention.

FIG. 5 schematically shows a partially exploded view of another piezoelectric motor 50 comprising a friction nub 80 in accordance with a preferred embodiment of the present invention. Piezoelectric motor 50 is mounted with a boss 82 comprising a threaded post 84 formed on a base 58. Friction nub 80 is formed with a hole 86 shown in ghost lines having threads that match the threads of post 84. Friction nub 80 is mounted to piezoelectric motor 50 by screwing it onto post 84 and dismounted by unscrewing it from post 84.

Whereas friction nubs 52, 74 and 80 are shown in FIGS. 2A–2C, FIG. 3 and FIG. 4 respectively with a piezoelectric vibrator having a particular shape, a friction nub may be used with piezoelectric vibrators having shapes, as known in the art, that are different from that shown in the figures. Furthermore, whereas the friction nubs are shown mounted on edge surface 26 substantially at the center of the edge surface, they may be mounted in other locations on the motor, such as close to a corner of the motor. A friction nub, in accordance with a preferred embodiment of the present invention, is useable in substantially all situations and in all positions on piezoelectric motors in which a prior art friction nub is useable. It should also be noted that the external shape of friction nubs and 90 can, in accordance with preferred embodiments of the present invention, be different from that shown in the figures and a shape different from that shown can be advantageous.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

The present invention has been described using detailed descriptions of preferred embodiments thereof that are provided by way of example and are not intended to limit the scope of the invention. The described preferred embodiments comprise different features, not all of which are required in all embodiments of the invention. Some embodiments of the present invention utilize only some of the features or possible combinations of the features. Variations of embodiments of the present invention that are described and embodiments of the present invention comprising different combinations of features noted in the described embodiments will occur to persons of the art. The scope of the invention is limited only by the following claims.

The invention claimed is:

1. A piezoelectric motor comprising:
a piezoelectric crystal having a boss bonded to a surface region thereof, the boss having a first surface region and wherein no surface of the boss substantially moves relative to the surface region of the crystal to which the boss is bonded when the crystal is excited to vibrate; and
a friction nub for transmitting vibratory motion of the surface of the piezoelectric crystal to a moveable element to which the friction nub is pressed, said friction nub formed with a second surface region that is substantially a negative relief of the first surface region, which first and second surface regions are coupled together.

2. A piezoelectric motor according to claim 1 wherein the boss comprises a protuberance and the first region is a surface of the protuberance.

3. A piezoelectric motor according to claim 2 wherein the protuberance is cylindrically symmetric.

4. A piezoelectric motor according to claim 2 wherein the friction nub is formed with a socket and wherein the second surface region is an internal surface region of the socket.

5. A piezoelectric motor according to claim 4 wherein the protuberance is conical.

6. A piezoelectric motor according to claim 5 wherein the protuberance is a Morse cone having a height and a cone angle equal to a Morse angle.

7. A piezoelectric motor according to claim 6 wherein the Morse cone is truncated.

8. A piezoelectric motor according to claim 7 wherein the socket is cone shaped and has a cone angle substantially equal to the equal to the cone angle of the Morse cone.

9. A piezoelectric motor according to claim 1 wherein the friction nub is formed with a protuberance and the second surface region is a surface region of the protuberance.

10. A piezoelectric motor according to claim 9 wherein the protuberance is cylindrically symmetric.

11. A piezoelectric motor according to claim 9 wherein the first surface region is a surface of a socket formed in the boss.

12. A piezoelectric motor according to claim 9 wherein the first surface region is an internal surface region of a socket formed in the surface of the boss.

13. A piezoelectric motor according to claim 1 wherein bonds that couple the first and second surface regions together are breakable by application of a force to the nub, without damage to the boss, the crystal or the bonding between the boss and the crystal.

14. A piezoelectric motor according to claim 2 wherein the protuberance is formed from steel.

15. A piezoelectric motor according to claim 2 wherein the protuberance is formed from brass.

16. A piezoelectric motor according to claim 1 wherein the first surface is a threaded surface and the second surface is a threaded surface threadable onto the first threaded surface.

17. A piezoelectric motor according to claim 16 wherein the first threaded surface is a surface of a post and the second threaded surface is a surface of a hole.

18. A piezoelectric motor according to claim 16 wherein the first threaded surface is a surface of a hole and the second threaded surface is a surface of a post.

19. A piezoelectric motor according to claim 18 wherein the hole is a hole in the boss.

20. A piezoelectric motor according to claim 2 wherein a surface region of the boss is glued to the surface region of the crystal.

21. A piezoelectric motor according to claim 20 wherein the surface region of the boss that is glued to the crystal is formed with at least one groove.

22. A piezoelectric motor according to claim 20 wherein the surface region of the crystal to which the surface region of the boss is glued is formed with at least one groove.

23. A piezoelectric motor according to claim 1 wherein the friction nub is formed from a cermet alloy.

24. A piezoelectric motor according to claim 23 wherein the cermet alloy has a grain size less than 2.5 microns.

25. A piezoelectric motor according to claim 23 wherein the cermet alloy has a grain size less than 1.75 microns.

26. A piezoelectric motor according to claim 23 wherein the cermet alloy has a grain size less than 1.4 microns.

27. A piezoelectric motor in accordance with claim 1 wherein the friction nub is formed with an external surface that facilitates grasping the friction nub with a grasping tool.

28. A piezoelectric motor in accordance with claim 1 wherein the first surface region is a non-planar surface region.

* * * * *